US009060415B2

(12) United States Patent
Fujikawa et al.

(10) Patent No.: US 9,060,415 B2
(45) Date of Patent: *Jun. 16, 2015

(54) METHOD FOR PRODUCING SUBSTRATE HAVING SURFACE NANOSTRUCTURE

(75) Inventors: Shigenori Fujikawa, Wako (JP); Harumi Hayakawa, Wako (JP); Takahiro Senzaki, Kawasaki (JP); Ken Miyagi, Kawasaki (JP)

(73) Assignees: Riken, Wako-shi (JP); Tokyo Ohka Kogyo Co., Ltd., Kawasaki-shi (JP)

( * ) Notice: Subject to any disclaimer, the term of this patent is extended or adjusted under 35 U.S.C. 154(b) by 22 days.

This patent is subject to a terminal disclaimer.

(21) Appl. No.: 13/984,405

(22) PCT Filed: Feb. 15, 2012

(86) PCT No.: PCT/JP2012/053499
§ 371 (c)(1),
(2), (4) Date: Aug. 8, 2013

(87) PCT Pub. No.: WO2012/111694
PCT Pub. Date: Aug. 23, 2012

(65) Prior Publication Data
US 2013/0313223 A1 Nov. 28, 2013

(30) Foreign Application Priority Data

Feb. 15, 2011 (JP) .................... 2011-030274
Sep. 12, 2011 (JP) .................... 2011-198764
Sep. 12, 2011 (JP) .................... 2011-198765

(51) Int. Cl.
*G03F 7/26* (2006.01)
*H05K 3/00* (2006.01)
*B81C 1/00* (2006.01)
*H01L 21/027* (2006.01)
*H01L 21/311* (2006.01)
(Continued)

(52) U.S. Cl.
CPC .............. *H05K 3/00* (2013.01); *B81C 1/00031* (2013.01); *B81C 2201/0149* (2013.01);
(Continued)

(58) Field of Classification Search
CPC .............. B81C 1/00031; B81C 2201/0149; H01L 21/31133; H01L 21/0271; G03F 7/325; G03F 7/168
USPC ........................................ 430/311, 322, 325
See application file for complete search history.

(56) References Cited

U.S. PATENT DOCUMENTS

| 6,565,763 B1 | 5/2003 | Asakawa et al. |
| 2009/0061170 A1 | 3/2009 | Fujikawa et al. |

(Continued)

FOREIGN PATENT DOCUMENTS

| JP | A-2005-029779 | 2/2005 |
| JP | A-2007-297644 | 11/2007 |

(Continued)

OTHER PUBLICATIONS

International Search Report issued in PCT/JP2012/053499 on Apr. 3, 2012.

(Continued)

*Primary Examiner* — Brittany Raymond
(74) *Attorney, Agent, or Firm* — Knobbe Martens Olson & Bear LLP (57) ABSTRACT

A method for producing a substrate having a surface nanostructure, including a forming, on a substrate, a layer containing a block copolymer having a plurality of blocks bonded together, and subsequently heating this layer to cause phase separation of the layer; a decomposing at least a portion of the phase including at least one block of the plurality of blocks that constitute the block copolymer of this layer; and immersing the layer in a developing solution and selectively removing the phase containing the decomposed block(s), the developing solution containing, as the main component, an organic solvent having an SP value of 7.5 to 11.5 $(cal/cm^3)^{1/2}$ and a vapor pressure at 25° C. that is less than 2.1 kPa, or benzene which may be substituted with an alkyl group, an alkoxy group or a halogen atom.

20 Claims, 2 Drawing Sheets

(51) Int. Cl.
    *G03F 7/16* (2006.01)
    *G03F 7/32* (2006.01)

(52) U.S. Cl.
    CPC ....... *H01L 21/0271* (2013.01); *H01L 21/0272* (2013.01); *H01L 21/31133* (2013.01); *G03F 7/168* (2013.01); *G03F 7/325* (2013.01)

(56) References Cited

U.S. PATENT DOCUMENTS

2009/0142256 A1   6/2009   Wakayama et al.
2011/0151236 A1   6/2011   Bosworth et al.

FOREIGN PATENT DOCUMENTS

| JP | A-2008-036491 | 2/2008 |
| JP | B-4127682 | 7/2008 |
| JP | A-2009-057518 | 3/2009 |
| JP | A-2009-138014 | 6/2009 |
| JP | A-2009-297837 | 12/2009 |
| JP | A-2011-126000 | 6/2011 |

OTHER PUBLICATIONS

Hinsberg et al., "Self-Assembling Materials for Lithographic Patterning: Overview, Status and Moving Forward," Proc. of SPIE, vol. 7637 76370G-1 to 76370G-11 (2010).

METHOD FOR PRODUCING SUBSTRATE HAVING SURFACE NANOSTRUCTURE

TECHNICAL FIELD

The present invention is related to a method for producing a substrate having a nanostructure formed thereon by using phase separation of a block copolymer.

This application is the U.S. National Phase under 35 U.S.C. §371 of International Application No. PCT/JP2011/053499, filed Feb. 15, 2012, designating the U.S., and published in Japanese as WO 2011/145696 on Nov. 24, 2011, which claims priority to Japanese Patent Application No. 2011-030274, filed Feb. 15, 2011; Japanese Patent Application No. 2011-198764, filed Sep. 12, 2011; and Japanese Patent Application No. 2011-198765, filed Sep. 12, 2011, the entire contents of which are incorporated herein by reference.

BACKGROUND ART

In recent years, the continued miniaturization of large scale integrated circuits (LSI) has lead to demands for techniques capable of processing ever finer structures. In response to these demands, a method has been disclosed for forming a very fine pattern using a phase-separated structure that is formed by the self-assembly of a block copolymer containing mutually incompatible polymers bonded together (for example, see Patent Document 1).

In order to utilize this type of block copolymer phase separation, a self-assembled nanostructure formed by microphase separation must be formed within only a specific region, and must be oriented in the required direction. In order to achieve this positional control and orientation control, methods such as graphoepitaxy, which controls the phase-separated pattern using a guide pattern, and chemical epitaxy, which controls the phase-separated pattern based on differences in the chemical state of the substrate, have been proposed (for example, see Non-Patent Document 1).

Methods for selectively removing a specific polymer region from the nanophase-separated structure of a block copolymer can be broadly classified into liquid phase methods and dry methods (for example, see Patent Document 2). A dry method (dry etching) is a method in which a reactive gas is blown onto the nanophase-separated structure, and selective removal is achieved based on the difference in the polymer decomposition rates in the presence of the dry gas. On the other hand, a liquid phase method (solution etching) is a method in which following selective decomposition, where necessary, of a polymer in a specific polymer region within the nanophase-separated structure, the nanophase-separated structure is immersed in a developing solution, and the specific phase portion of the structure is dissolved preferentially. In solution etching, a developing solution having an aqueous solution base is generally used. This is based on the high solubility in aqueous solutions of the substances thought to be formed upon polymer decomposition.

DOCUMENTS OF RELATED ART

Patent Documents

Patent Document 1: Japanese Unexamined Patent Application, First Publication No. 2008-36491
Patent Document 2: Japanese Patent (Granted) Publication No. 4,127,682

Non-Patent Document

Non-Patent Document 1: Proceedings of SPIE, vol. 7637, 76370G-1 (2010).

SUMMARY OF THE INVENTION

Problems to be Solved by the Invention

In the case of dry etching, the surface of the polymer region that exhibits a slower polymer decomposition rate in the presence of the dry gas is also prone to decomposition and removal. Accordingly, in the obtained nanopattern, it is difficult to precisely reflect the nanophase-separated structure, particularly in the height direction. Moreover, because dry etching is generally performed in a reduced-pressure atmosphere, designing a continuous process is problematic, and equipment is required for performing the pressure reduction and for introducing the reactive gas, meaning the process becomes very costly.

In contrast, in solution etching, this type of expensive equipment is unnecessary. However, because water has an extremely high surface tension, if a developing solution having an aqueous solution base is used, then a problem arises in that the formed nanostructure (nanopattern) may collapse during the etching operation or during the drying step performed following etching.

The present invention takes the above circumstances into consideration, with an object of providing a method for producing a substrate having a surface nanostructure that more precisely reflects a nanophase-separated structure, the method using the phase separation of a block copolymer.

Means to Solve the Problems

In order to achieve the above object, the present invention employs the aspects described below.

In other words, a first aspect of the present invention is a method for producing a substrate having a surface nanostructure, the method including:

a phase separation step of forming, on a substrate, a layer containing a block copolymer having a plurality of blocks bonded together, and subsequently heating the layer to cause phase separation of the layer, a decomposition step of decomposing at least a portion of a phase composed of at least one block of the plurality of blocks that constitute the block copolymer of the layer, and a selective removal step of immersing the layer in a developing solution and selectively removing a phase containing the block(s) decomposed in the decomposition step, wherein the developing solution contains, as the main component, an organic solvent having an SP value of 7.5 to 11.5 (cal/cm$^3$)$^{1/2}$ and a vapor pressure at 25° C. that is less than 2.1 kPa, or benzene which may be substituted with an alkyl group, an alkoxy group or a halogen atom.

In the present description and the claims, a "block" is a partial structural component, which is composed only of structural units of the same type bonded together, and constitutes part of a block copolymer.

Effects of the Invention

The present invention is able to provide a method for producing a substrate having a surface nanostructure that more precisely reflects a nanophase-separated structure.

EMBODIMENTS OF THE INVENTION

The method for producing a substrate having a surface nanostructure according to the present invention includes: a phase separation step of forming, on a substrate, a layer containing a block copolymer having a plurality of blocks bonded together, and subsequently heating the layer to cause phase separation of the layer, a decomposition step of decomposing at least a portion of a phase composed of at least one block of the plurality of blocks that constitute the block copolymer of the layer, and a selective removal step of immersing the layer in a developing solution and selectively removing the phase containing the polymer(s) decomposed in the decomposition step, wherein the developing solution contains, as the main component, an organic solvent having an SP value of 7.5 to 11.5 (cal/cm$^3$)$^{1/2}$ and a vapor pressure at 25° C. that is less than 2.1 kPa, or benzene which may be substituted with an alkyl group, an alkoxy group or a halogen atom.

Upon phase separation, the layer containing the block copolymer having a plurality of blocks bonded together forms a structure in which each of the components that constitute the block copolymer have separated. In the present invention, by first selectively removing one or a plurality of phases within this phase-separated structure so that at least one phase within the phase-separated structure is retained, a nanostructure formed from the retained phase(s) can be formed on the substrate. Further, by appropriately adjusting the size and shape of the phase-separated structure formed on the substrate, a nanostructure having the desired shape and size can be formed on the substrate.

In the present invention, by using an organic solvent having an SP value (solubility parameter) within a specific range as the main component of the developing solution used in the solution etching, the specified phase(s) within the nanophase-separated structure can be selectively removed without any accompanying pattern collapse. Further, by ensuring that the organic solvent used as the main component of the developing solution has a low vapor pressure at 25° C. of less than 2.1 kPa, localized volatilization of the developing solution organic solvent during the puddle development used during a typical lithography process can be suppressed, and a pattern having good in-plane uniformity can be obtained. Furthermore, by using a solvent, selected from among the organic solvents already being widely used in semiconductor processes, which has an SP value and a vapor pressure that satisfy the respective ranges mentioned above, a patterning process is achieved that is simple and capable of high throughput.

Further, in the present invention, by using benzene which may be substituted with an alkyl group, an alkoxy group or a halogen atom as the main component of the developing solution used in the solution etching, the specified phase(s) within the nanophase-separated structure can be selectively removed without any accompanying pattern collapse. Furthermore, by selecting, as the main component for the developing solution, a compound having a specific structure from among the organic solvents already being widely used in semiconductor processes, a patterning process is achieved that is simple and capable of high throughput.

Each of the above steps, and the materials used in those steps, are described below in detail.

<Block Copolymer>

A block copolymer is a polymeric material in which a plurality of partial structural components (blocks), each composed only of structural units of the same type bonded together, are bonded together. As the blocks constituting the block copolymer, two types of blocks may be used, or three or more types of blocks may be used.

In the present invention, the plurality of blocks constituting the block copolymer are not particularly limited, provided they represent a combination capable of causing phase separation. However, it is preferable to use a combination of blocks which are mutually incompatible. Further, it is preferable to use a combination in which a phase composed of at least one block among the plurality of polymers constituting the block copolymer can be selectively removed more easily than the phase(s) composed of the other block(s).

Examples of the block copolymer include a block copolymer having a block with a structural unit of styrene or a derivative thereof bonded to a block with a structural unit of a (meth)acrylate ester, a block copolymer having a block with a structural unit of styrene or a derivative thereof bonded to a block with a structural unit of a siloxane or a derivative thereof, and a block copolymer having a block with a structural unit of an alkylene oxide bonded to a block with a structural unit of a (meth)acrylate ester. The term "(meth)acrylate ester" is a generic term that includes either or both of the acrylate ester having a hydrogen atom bonded to the α-position and the methacrylate ester having a methyl group bonded to the α-position.

As the (meth)acrylate ester, for example, (meth)acrylic acid having a substituent such as an alkyl group or a hydroxyalkyl group bonded to the carbon atom of the (meth)acrylic acid can be used. Examples of the alkyl group used as the substituent include linear, branched or cyclic alkyl groups of 1 to 10 carbon atoms. Specific examples of the (meth)acrylate ester include methyl (meth)acrylate, ethyl (meth)acrylate, propyl (meth)acrylate, cyclohexyl (meth)acrylate, octyl (meth)acrylate, nonyl (meth)acrylate, hydroxyethyl (meth)acrylate, hydroxypropyl (meth)acrylate, benzyl (meth)acrylate, anthracene (meth)acrylate, glycidyl (meth)acrylate, 3,4-epoxycyclohexylmethane (meth)acrylate and propyltrimethoxysilane (meth)acrylate.

Examples of the styrene derivative include α-methylstyrene, 2-methylstyrene, 3-methylstyrene, 4-methyl styrene, 4-t-butyl styrene, 4-n-octylstyrene, 2,4,6-trimethylstyrene, 4-methoxystyrene, 4-t-butoxystyrene, 4-hydroxystyrene, 4-nitrostyrene, 3-nitrostyrene, 4-chlorostyrene, 4-fluorostyrene, 4-acetoxyvinylstyrene, vinylcyclohexane, 4-vinylbenzyl chloride, 1-vinylnaphthalene, 4-vinylbiphenyl, 1-vinyl-2-pyrrolidone, 9-vinylanthracene and vinylpyridine.

Examples of the siloxane derivative include dimethylsiloxane, diethylsiloxane, diphenylsiloxane and methylphenylsiloxane.

Examples of the alkylene oxide include ethylene oxide, propylene oxide, isopropylene oxide and butylene oxide.

In the present invention, it is preferable to use a block copolymer having a block with a structural unit of styrene or a derivative thereof bonded to a block with a structural unit of a (meth)acrylate ester. Specific examples thereof include a polystyrene-polymethyl methacrylate (PS-PMMA) block copolymer, a polystyrene-polyethyl methacrylate block copolymer, a polystyrene-(poly-t-butyl methacrylate) block copolymer, a polystyrene-polymethacrylic acid block copolymer, a polystyrene-polymethyl acrylate block copolymer, a polystyrene-polyethyl acrylate block copolymer, a polystyrene-(poly-t-butyl acrylate) block copolymer, and a polystyrene-polyacrylic acid block copolymer. In the present invention, it is particularly preferable to use a PS-PMMA block copolymer.

The weight-average molecular weight (Mw) (the polystyrene equivalent value determined by gel permeation chromatography) of each of the blocks that constitute the block copolymer is not particularly limited as long as it is large enough to cause phase separation. The weight-average molecular weight is preferably from 5,000 to 500,000, more preferably from 5,000 to 400,000, and still more preferably from 5,000 to 300,000.

The polydispersity index (Mw/Mn) of the block copolymer is preferably from 1.0 to 3.0, more preferably from 1.0 to 1.5, and still more preferably from 1.0 to 1.2. Mn represents the number-average molecular weight.

In the following description, among the blocks that constitute the block copolymer, a block which is not selectively removed in a later step is referred to as a "$P_A$ block", and a block which is to be selectively removed is referred to as a "$P_B$ block". For example, after the phase separation of a layer containing a PS-PMMA block copolymer, by subjecting the layer to a decomposition treatment and a developing treatment, the phase composed of PMMA is selectively removed. In such a case, PS represents the $P_A$ block, and PMMA represents the $P_B$ block.

In the present invention, the shape and size of the phase that is to be selectively removed (namely, the phase composed of the $P_B$ block) is determined by the compositional ratio of the respective blocks that constitute the block copolymer, and the molecular weight of the block copolymer. For example, by making the compositional ratio per volume of the $P_B$ block within the block copolymer relatively small, a cylinder structure can be formed in which the phase composed of the $P_B$ block exists in a cylindrical form within the phase composed of the $P_A$ block. On the other hand, by making the compositional ratio per volume of the $P_B$ block within the block copolymer about the same as that of the $P_A$ block, a lamellar structure can be formed in which the phase composed of the $P_A$ block and the phase composed of the $P_B$ block are laminated in an alternating manner. Further, by increasing the molecular weight of the block copolymer, the size of each phase can be increased.

<Substrate>

There are no particular limitations on the substrate, provided that the solution containing the block copolymer can be applied to the surface of the substrate. Examples of the substrate include metals such as silicon, copper, chromium, iron and aluminum, substrates formed from inorganic substances such as glass, titanium oxide, silica and mica, and substrates formed from organic compounds such as acrylic sheets, polystyrene, cellulose, cellulose acetate and phenolic resins.

Further, there are no particular limitations on the size or shape of the substrate used in the present invention. The substrate need not necessarily have a smooth surface, and substrates of various shapes formed from all manner of materials can be selected as appropriate. For example, substrates having a curved surface, flat substrates having surface unevenness, and even thin flake-shaped substrates can be used.

The substrate may have an electron-donating surface. By using a substrate having electron donating properties, an oxidation-reduction reaction (galvanic displacement reaction) can be effected with metal ions. Examples of this type of substrate include a silicon wafer, and a metal substrate formed from a metal such as copper, chromium, iron or aluminum. Alternatively, a polycarbonate substrate or a glass substrate (such as quartz glass) provided with a surface electron-donating film such as a silicon thin film may be used, so that a galvanic displacement by an oxidation-reduction reaction can be effected on the substrate surface.

<Substrate Washing Treatment>

Before forming a layer containing a block copolymer, the surface of the substrate may be washed. By washing the surface of the substrate, the neutralization reaction treatment performed in a later step may be able to be performed more satisfactorily.

A conventional method may be used as the washing treatment, and examples include an oxygen plasma treatment, an ozone oxidation treatment, an acid alkali treatment, and a chemical modification treatment. For example, the substrate may be immersed in an acidic solution such as a sulfuric acid/hydrogen peroxide aqueous solution, followed by washing with water and drying. Thereafter, a layer containing a block copolymer can be formed on the surface of the substrate.

<Neutralization Treatment>

A "neutralization treatment" is a treatment in which the surface of the substrate is modified so as to have affinity for all the blocks that constitute the block copolymer. By performing a neutralization treatment, it is possible to prevent the situation in which only those phases composed of specific blocks come into contact with the surface of the substrate due to phase separation. For this reason, it is preferable to perform a neutralization treatment of the substrate surface that is appropriate for the type of block copolymer being used, prior to forming the layer containing the block copolymer. In particular, in order to form a lamellar structure or a cylinder structure arranged in a perpendicular direction relative to the surface of the substrate by phase separation, it is preferable to perform a neutralization treatment of the substrate surface in advance.

A specific example of the neutralization treatment is a treatment in which a thin film (neutralization film) containing an undercoat agent having affinity for all the blocks that constitute the block copolymer is formed on the surface of the substrate.

A film composed of a resin composition can be used as this type of neutralization film. The resin composition used as the undercoat agent can be selected appropriately from conventional resin compositions used for forming thin films, in accordance with the type of blocks that constitute the block copolymer. The resin composition used as the undercoat agent may be a heat-polymerizable resin composition, or a photosensitive resin composition such as a positive resist composition or a negative resist composition.

Alternatively, the neutralization film may be a non-polymerizable film. For example, a siloxane-based organic monomolecular film formed from an undercoat agent such as phenethyltrichlorosilane, octadecyltrichlorosilane or hexamethyldisilazane may be used favorably as the neutralization film.

The neutralization film formed from such an undercoat agent can be formed by a conventional method.

Examples of the undercoat agent having affinity for all the blocks that constitute the block copolymer include a resin composition containing all the structural units of the blocks that constitute the block copolymer, and a resin containing all structural units which have high affinity for the blocks that constitute the block copolymer.

For example, when a PS-PMMA block copolymer is used, for the undercoat agent, it is preferable to use a resin composition containing both PS and PMMA as structural units, or a compound or a composition containing both an aromatic ring which functions as a portion having high affinity for PS, and a functional group with high polarity which functions as a portion having high affinity for PMMA.

Examples of the resin composition containing both PS and PMMA as structural units include random copolymers of PS and PMMA, and alternating polymers of PS and PMMA (copolymers in which the respective monomers are copolymerized in an alternating arrangement).

Examples of the composition containing both a portion having high affinity for PS and a portion having high affinity for PMMA include resin compositions obtained by polymerizing at least a monomer having an aromatic ring and a monomer having a substituent with high polarity. Examples of the monomer having an aromatic ring include monomers having a group in which one hydrogen atom has been removed from the ring of an aromatic hydrocarbon, such as a phenyl group, biphenyl group, fluorenyl group, naphthyl group, anthryl group or phenanthryl group, and monomers having a heteroaryl group such as an aforementioned aromatic group in which a portion of the carbon atoms that constitute the ring of the group has been substituted with a hetero atom such as an oxygen atom, a sulfur atom or a nitrogen atom. Examples of the monomer having a substituent with high polarity include monomers having a trimethoxysilyl group, trichlorosilyl group, carboxyl group, hydroxyl group, cyano group, or hydroxyalkyl group in which some of the hydrogen atoms of the alkyl group have each been substituted with a fluorine atom.

Moreover, examples of the compound containing both a portion having high affinity for PS and a portion having high affinity for PMMA include compounds having both an aryl group and a substituent with high polarity, such as phenethyltrichlorosilane, and compounds having both an alkyl group and a substituent with high polarity, such as an alkylsilane compound.

<Guide Pattern Formation 1>

A guide pattern having a predetermined pattern may be formed in advance on the substrate surface, prior to the formation of the layer containing the block copolymer. As a result, it becomes possible to control the arrangement of the phase-separated structure in accordance with the shape and surface properties of the guide pattern. For example, even in the case of a block copolymer that forms a random fingerprint-patterned phase-separated structure in the absence of a guide pattern, by introducing a resist film trench structure on the surface of the substrate, a phase-separated structure that is aligned along the trench can be obtained. A guide pattern may be introduced following these types of principles. For example, a structure having a physical shape such as an L/S pattern or a contact hole pattern can be used as the guide pattern. Further, when the surface of the guide pattern has affinity for any one of the polymers that constitute the block copolymer, a phase-separated structure having a lamellar structure or a cylinder structure arranged in the perpendicular direction relative to the surface of the substrate can be formed with greater reliability.

For example, a substrate having a metal pattern formed thereon in advance can be used as a substrate provided with a guide pattern on the substrate surface. Further, a substrate having a pattern formed on the surface thereof by a lithography method or an imprint method can also be used. Among these, a substrate prepared using a lithography method is preferable. For example, a guide pattern can be formed by forming a film composed of a resist composition having affinity for one of the polymers that constitute the block copolymer on the surface of the substrate, subsequently performing selective exposure of the film using radial rays such as light or an electron beam through a mask having a predetermined pattern formed therein, and then performing a development treatment. When the substrate is to be subjected to a neutralization treatment, it is preferable to first perform the neutralization treatment, and subsequently form the guide pattern on the surface of the neutralization film.

A guide pattern having a physical shape can be formed using a positive resist composition containing a base component that exhibits increased solubility in an alkali developing solution under the action of acid, and an acid generator component that generates acid upon exposure. When this positive resist composition is irradiated (exposed) with radial rays, acid is generated from the acid generator component, and the action of that acid causes the base component to increase in polarity, thereby increasing the solubility in an alkali developing solution. Accordingly, during formation of a guide pattern, when a resist film obtained using such a resist composition is subjected to selective exposure, the solubility of the exposed portions of the resist film in an alkali developing solution increases, whereas the unexposed portions remain substantially insoluble in the alkali developing solution, and therefore performing alkali developing removes the exposed portions and forms a guide pattern. A composition containing a base component which exhibits increased solubility in an alkali developing solution under the action of acid, and which also generates acid upon exposure, can also be used as the positive resist composition.

In a specific example, an aforementioned positive resist composition is applied to the surface of the substrate using a spinner or the like, and a prebake (post applied bake (PAB)) is conducted under temperature conditions of 80 to 150° C. for 40 to 120 seconds, and preferably 60 to 90 seconds, to form a resist film, an ArF exposure apparatus or the like is then used to selectively expose this resist film with ArF excimer laser light through a desired mask pattern, and the resist film is then subjected to a post exposure bake (PEB) under temperature conditions of 80 to 150° C. for 40 to 120 seconds, and preferably 60 to 90 seconds. Subsequently, the resist film is subjected to a developing treatment using an alkali developing solution such as a 0.1 to 10% by weight aqueous solution of tetramethylammonium hydroxide (TMAH), and is then preferably rinsed in pure water and dried. Further, in some cases, a bake treatment (post bake) may be conducted following the developing treatment. In this manner, a guide pattern that is faithful to the mask pattern can be formed.

Furthermore, a guide pattern can also be formed using a negative development resist composition containing a base component which exhibits increased polarity and reduced solubility in a developing solution containing an organic solvent under the action of acid, and an acid generator component that generates acid upon exposure. When this negative development resist composition is irradiated (exposed) with radial rays, acid is generated from the base component, and the action of that acid causes a decrease in the solubility of the base component in an organic solvent. Accordingly, during formation of a guide pattern, when a resist film obtained using such a resist composition is subjected to selective exposure, the solubility of the exposed portions of the resist film in an organic developing solution containing the organic solvent decreases, whereas the unexposed portions remain soluble in the organic developing solution, and therefore performing negative developing using the organic developing solution removes the unexposed portions and forms a guide pattern.

Moreover, a guide pattern can also be formed using a negative resist composition containing a base component that is soluble in an alkali developing solution, an acid generator that generates acid upon exposure, and a crosslinking agent. In this negative resist composition, when acid is generated from the acid generator component upon exposure, the action of that acid causes crosslinking to occur between the base component and the crosslinking agent, making the base component substantially insoluble in an alkali developing solution. Accordingly, during formation of a guide pattern, when a resist film obtained using such a resist composition is subjected to selective exposure, the exposed portions of the resist film become substantially insoluble in an alkali developing solution, whereas the unexposed portions remain soluble in the alkali developing solution, and therefore performing alkali developing removes the unexposed portions and forms a guide pattern.

The height of the guide pattern from the surface of the substrate (or from the surface of the neutralization film) is preferably at least as large as the thickness of the layer containing the block copolymer which is to be formed on the surface of the substrate. The height of the guide pattern from the surface of the substrate (or from the surface of the neutralization film) can be adjusted appropriately by altering the film thickness of the resist film formed by applying the resist composition used for forming the guide pattern.

The resist composition used for forming the guide pattern can employ a composition having affinity for any one of the blocks that constitute the block copolymer, and may be selected appropriately from among resist compositions typically used for forming resist patterns and modified products thereof. The resist composition may be either a positive resist composition or a negative resist composition, but a negative resist composition is preferable.

Following casting of an organic solvent solution of the block copolymer onto the substrate on which the guide pattern has been formed, a heat treatment is performed to effect the phase separation. Accordingly, the resist composition used for forming the guide pattern is preferably capable of forming a resist film which exhibits excellent solvent resistance and heat resistance.

<Guide Pattern Formation 2>

A more planar guide pattern may be formed on the surface of the substrate instead of the aforementioned type of guide pattern composed of a structure having physical unevenness. In other words, a chemical pattern formed so that different regions of the surface exhibit different chemical properties can also be used, despite having no physical shape. Specifically, a guide pattern can be used which is composed of regions having affinity for one of the blocks that constitute the block copolymer and other regions.

A planar guide pattern can be formed, for example, as follows. First, using an undercoat agent which contains a photosensitive resist composition or a composition that undergoes polymerization or cleavage of the main chain upon electron beam irradiation, and which has affinity for one of the blocks that constitute the block copolymer, this undercoat agent is applied to the surface of the substrate to form a resist film. Subsequently, this resist film is subjected to selective exposure using radial rays such as light or an electron beam through a mask having a predetermined pattern formed therein, and a developing treatment is then performed, thereby forming, on the surface of the substrate, a predetermined pattern of a thin film which has affinity for one of the blocks that constitute the block copolymer. In this manner, a planar guide pattern can be formed in which regions formed from the undercoat agent and regions from which the undercoat agent has been removed are arranged in a predetermined pattern.

The undercoat agent used for forming this type of guide pattern can be selected appropriately from among those conventional photosensitive resin compositions which are used for forming thin films and have the desired properties.

<Formation of Phase-Separated Structure of the Layer Containing the Block Copolymer>

First, a layer containing the block copolymer is formed on the substrate. Specifically, a solution of the block copolymer dissolved in a suitable organic solvent is applied to the substrate using a spinner or the like.

Any organic solvent may be used as the organic solvent for dissolving the block copolymer, provided it is capable of dissolving the block copolymer being used to form a uniform solution, and an organic solvent having high compatibility with all of the polymers constituting the block copolymer can be used. These types of organic solvents may be used individually, or as a mixed solvent containing two or more solvents.

Examples of the organic solvent for dissolving the block copolymer include:

lactones such as γ-butyrolactone;

ketones such as acetone, methyl ethyl ketone, cyclohexanone, methyl-n-pentyl ketone, methyl isopentyl ketone and 2-heptanone;

polyhydric alcohols such as ethylene glycol, diethylene glycol, propylene glycol and dipropylene glycol;

polyhydric alcohol derivatives, including compounds having an ester bond, such as ethylene glycol monoacetate, diethylene glycol monoacetate, propylene glycol monoacetate and dipropylene glycol monoacetate, and compounds having an ether bond, such as a monoalkyl ether (such as a monomethyl ether, monoethyl ether, monopropyl ether or monobutyl ether) or a monophenyl ether of any of the above polyhydric alcohols or compounds having an ester bond [among these compounds, propylene glycol monomethyl ether acetate (PGMEA) and propylene glycol monomethyl ether (PGME) are preferable];

cyclic ethers such as dioxane; esters such as methyl lactate, ethyl lactate (EL), methyl acetate, ethyl acetate, butyl acetate, methyl pyruvate, ethyl pyruvate, methyl methoxypropionate and ethyl ethoxypropionate; and aromatic organic solvents such as anisole, ethyl benzyl ether, cresyl methyl ether, diphenyl ether, dibenzyl ether, phenetole, butyl phenyl ether, ethylbenzene, diethylbenzene, pentylbenzene, isopropylbenzene, toluene, xylene, cymene and mesitylene.

For example, when a PS-PMMA block copolymer is used as the block copolymer, the block copolymer is preferably dissolved in toluene, butyl acetate, 2-heptanone or PGMEA, is more preferably dissolved in toluene, 2-heptanone or PGMEA, and is most preferably dissolved in 2-heptanone or PGMEA.

In the present invention, the thickness of the layer containing the block copolymer must be sufficiently large to enable phase separation to occur. There are no particular limitations on the lower limit for this thickness, but in consideration of the size of the structure period within the phase-separated structure that is to be formed, and the uniformity of the nanostructure, the thickness of the layer is preferably at least 5 nm, and more preferably 10 nm or greater. Further, in those cases where, as described below, the nanostructure formed on the substrate is used as a template to fabricate a substrate provided with a metal nanostructure, the thickness of the layer containing the block copolymer that is formed on the surface of the substrate may be set appropriately so that the thickness is greater than the height dimension from the substrate of the metal nanostructure that is to be formed.

The substrate having the layer containing the block copolymer formed thereon is subjected to a heat treatment, and a phase-separated structure is formed which enables at least a portion of the surface of the substrate to be exposed by selective removal of the block copolymer in a later step. The temperature of the heat treatment is preferably at least as high as the glass transition temperature but less than the thermal decomposition temperature of the block copolymer being used. Further, the heat treatment is preferably conducted within a gas having low reactivity such as nitrogen.

<Decomposition of Phase Composed of $P_B$ Block in Phase-Separated Structure>

Next, following formation of the phase-separated structure, the layer containing the block copolymer on the substrate is treated to decompose (reduce in molecular weight) at least a portion of the block within the phase composed of the $P_B$ block. By decomposing a portion of the $P_B$ block in advance, the solubility within the developing solution can be enhanced, and as a result, the phase composed of the $P_B$ block can be selectively removed more easily from the phase composed of the $P_A$ block.

There are no particular limitations on the decomposition treatment, provided it is capable of decomposing the $P_B$ block preferentially to the $P_A$ block, and the treatment may be selected appropriately from among the types of techniques used in block decomposition, in accordance with the nature of the $P_A$ block and the $P_B$ block. Specific examples of the decomposition treatment include a UV (ultraviolet) irradiation treatment, an ArF excimer laser irradiation treatment, a thermal decomposition treatment, and a chemical reaction treatment.

In the present invention, performing the decomposition treatment by UV irradiation is preferable. By using a UV irradiation treatment, curing of the $P_A$ block can be accelerated at the same time as the decomposition of the $P_B$ block. The UV exposure dose employed in the UV irradiation treatment can be adjusted appropriately in accordance with the nature of the $P_A$ block and the $P_B$ block. If the UV exposure dose is too small, then the decomposition of the $P_B$ block may not proceed sufficiently, whereas if the UV exposure dose is too large, the $P_A$ block may also undergo decomposition. For example, in the case where a PS-PMMA block copolymer is used, the UV exposure dose at a wavelength of 254 nm is preferably within a range from 1 to 100 mJ/cm$^2$, and more preferably from 10 to 50 mJ/cm$^2$.

Furthermore, in the present invention, performing the decomposition treatment by ArF excimer laser irradiation is also preferable. By using an ArF excimer laser irradiation treatment, curing of the $P_A$ block can be accelerated at the same time as the decomposition of the $P_B$ block. The ArF exposure dose employed in the ArF excimer laser irradiation treatment can be adjusted appropriately in accordance with the nature of the $P_A$ block and the $P_B$ block. If the ArF exposure dose is too small, then the decomposition of the $P_B$ block may not proceed sufficiently, whereas if the ArF exposure dose is too large, the $P_A$ block may also undergo decomposition. For example, the ArF exposure dose at a wavelength of 193 nm is preferably within a range from 400 to 4,000 mJ/cm$^2$, and more preferably from 800 to 3,600 mJ/cm$^2$.

<Selective Removal of Phase Composed of $P_B$ Block in Phase Separation Structure>

Subsequently, following formation of the phase-separated structure, the phase composed of the exposed $P_B$ block is selectively removed from the layer containing the block copolymer formed on the substrate. As a result, only the phase composed of the $P_A$ block remains on the exposed surface of the substrate. In other words, a nanostructure having a surface formed only from the phase composed of the $P_A$ block is formed on the surface of the substrate. When the phase-separated structure is a lamellar structure or a cylinder structure arranged in a perpendicular direction relative to the surface of the substrate, selectively removing the phase composed of the $P_B$ block results in the formation of a line or a hole nanostructure formed only from the $P_A$ block on the substrate.

As a result of the selective removal, the phase composed of the $P_B$ block is removed as a continuous phase formed from the substrate surface through to the surface of the layer containing the block copolymer, thus exposing the surface of the substrate. In those cases where a neutralization film has been formed in advance on the surface of the substrate, this neutralization film is also removed together with the phase composed of the $P_B$ block. However, when a guide pattern has been formed in advance on the surface of the substrate, the guide pattern is not removed, but is rather retained in the same manner as the block $P_A$.

In the present invention, the selective removal treatment is performed by immersing the substrate having the phase-separated structure formed thereon in a developing solution containing, as the main component, an organic solvent having an SP value of 7.5 to 11.5 (cal/cm$^3$)$^{1/2}$ and a vapor pressure at 25° C. that is less than 2.1 kPa, or benzene which may be substituted with an alkyl group, an alkoxy group or a halogen atom, thereby selectively dissolving and removing the phase composed of the $P_B$ block.

When the developing solution contains, as the main component, an organic solvent having an SP value of 7.5 to 11.5 (cal/cm$^3$)$^{1/2}$ and a vapor pressure at 25° C. that is less than 2.1 kPa, the SP value of the organic solvent is preferably within a range from 8.0 to 10.5 (cal/cm$^3$)$^{1/2}$, and more preferably from 8.4 to 9.5 (cal/cm$^3$)$^{1/2}$. In the description of the present invention, the SP value refers to the value estimated by the theoretical formula disclosed on pages 679 and 680 of "Polymer Handbook (Fourth Edition)" (edited by Brandrup et al., 1999, John Wiley & Sons, Inc.).

The developing solution may contain a single organic solvent having an SP value of 7.5 to 11.5 (cal/cm$^3$)$^{1/2}$ and a vapor pressure at 25° C. that is less than 2.1 kPa, or may contain two or more such organic solvents. Further, the developing solution may also contain one or more other components besides the organic solvent having an SP value of 7.5 to 11.5 (cal/cm$^3$)$^{1/2}$ and a vapor pressure at 25° C. that is less than 2.1 kPa, provided this does not impair the effects of the present invention. Examples of the other component(s) include organic solvents having a vapor pressure at 25° C. of 2.1 kPa or greater, such as ethyl acetate.

In the present invention, the main component of the developing solution is preferably butyl acetate, 2-heptanone or PGMEA. Further, the developing solution preferably contains one or more compounds selected from the group consisting of butyl acetate, 2-heptanone and PGMEA.

Further, when the developing solution contains, as the main component, benzene which may be substituted with an alkyl group, an alkoxy group or a halogen atom, examples of the alkyl group include alkyl groups of 1 to 5 carbon atoms, examples of the alkoxy group include alkoxy groups of 1 to 5 carbon atoms, and examples of the halogen atom include a fluorine atom and a chlorine atom. The benzene used as the main component of the developing solution may be substituted with only one of these substituents, may be substituted with two or more of the same or different substituents, or may be unsubstituted.

In the present invention, the main component of the developing solution is preferably benzene, toluene, ethylbenzene, xylene, anisole or chlorobenzene, and is more preferably toluene or benzene. Further, the developing solution preferably contains one or more compounds selected from the group consisting of benzene, toluene, ethylbenzene, xylene, anisole and chlorobenzene.

The selectivity during the removal of the phase composed of the $P_B$ block by the developing solution (namely, the resistance to removal of the phase composed of the $P_A$ block), and the preservation of the nanostructure (the degree of conformity between the nanostructure formed by removing only the phase composed of the exposed $P_B$ block from the nanophase-separated structure, and the nanostructure actually formed) may sometimes vary depending on the type of solvent used for dissolving the block copolymer. For example, when the solvent used for dissolving the block copolymer is toluene or PGMEA, the main component of the developing solution is preferably butyl acetate, 2-heptanone, PGMEA, toluene or benzene.

<Formation of Metal Nanostructure>

A nanostructure formed from a metal can be formed on the substrate by using a nanostructure formed on the substrate as a template. In the present invention, by using, as a template, a phase-separated structure that is capable of forming a finer pattern than a resist pattern, a substrate having a metal nanostructure with an extremely fine shape can be formed.

In the present invention, by performing the selective removal of the phase composed of the $P_B$ block within the nanophase-separated structure, not by dry etching, but rather by performing solution etching using a developing solution containing a specific organic solvent as the active component, a nanopattern that more precisely reflects the nanophase-separated structure can be formed. In the present invention, because the surface of the phase composed of the $P_A$ block undergoes almost no removal during the etching treatment, a metal nanostructure can be formed which has a height dimension substantially equal to the thickness of the layer containing the block copolymer formed on the substrate.

There are no particular limitations on the method used for forming the metal nanostructure, and the method may be selected appropriately from the types of methods used when forming a metal structure using a template formed from a polymer.

Specific examples include a method in which an electroless plating method or a sputtering method or the like is used to form a metal thin film on the surface of the template (for example, see Japanese Unexamined Patent Application, First Publication No. 2009-57518 or Japanese Unexamined Patent Application, First Publication No. 2009-297837), and a method in which a metal is deposited using a galvanic substitution reaction.

Following the selective removal treatment and prior to the metal nanostructure formation, the exposed substrate surface is preferably subjected to a washing treatment. This treatment can be performed using the same treatments as those described above for the substrate washing treatment.

Further, the substrate having the metal nanostructure formed thereon may be used as is, or the residual layer containing the block copolymer on the substrate, namely the phase composed of the $P_A$ block, may be removed. For example, if the substrate having the metal nanostructure formed thereon is subjected to a hydrogen plasma treatment, then the phase composed of the $P_A$ block or the like can be removed from the substrate.

<Method for Forming Metal Thin Film>

First is a description of a method for forming a metal thin film on the template.

For example, a coating film composed of a thin metal film can be formed using an electroless plating method or a sputtering method.

Electroless plating is performed by bringing a plating solution containing ions of a predetermined metal into contact with the template surface, and then reducing the ions (to deposit the metal), and this method enables the formation of a metal thin film formed from the predetermined metal.

In those cases where the target metal is inappropriate for direct electroless plating (for example, noble metals such as gold), if a metal (such as nickel) having a higher ionization tendency than the target metal is used to form a metal thin film in advance by electroless plating, then the metal thin film of the target metal can subsequently be formed comparatively easily by substituting the metal of the metal thin film with the target metal.

There are no particular limitations on the metal used for the electroless plating, and any of the types of metals typically used in electroless plating can be used, including gold, silver, copper, nickel, cobalt, tin, and platinum group metals (palladium, platinum, rhodium and ruthenium). Among these, at least one metal selected from the group consisting of gold, silver, copper, nickel and cobalt is preferable, as the plating techniques for these metals are generally the most well established.

When the metal that constitutes the metal thin film is a metal that exhibits electrical conductivity, a metal nanostructure that exhibits electrical conductivity can be formed. In the present invention, the metal that exhibits conductivity is preferably at least one metal selected from the group consisting of gold, silver and copper.

Further, in terms of being able to obtain a structure having ferromagnetism, cobalt is also desirable as the metal that constitutes the metal thin film.

Reduction of the metal ions can be performed using a conventional method. Specific examples of methods that may be used include methods that employ a reduction reaction catalyst (a catalyst for the electroless plating), and methods in which a metal having a higher ionization tendency than the plating metal is substituted.

In the present invention, the aforementioned electroless plating is preferably performed after a catalyst for the electroless plating has been introduced on the surface of the substrate. This catalyst functions as a nucleus for the electroless plating, and accelerates the reduction reaction of metal ions which make contact with the substrate surface, meaning a metal thin film can be formed on the substrate surface efficiently and with high plating selectivity.

Microparticles or thin films of metals are generally used as the catalyst for electroless plating.

The metal used as the catalyst varies depending on the type of metal undergoing plating, but usually, the same metal as the plating metal or a metal that is more readily ionized than the plating metal is used as the catalyst.

Specifically, when silver is the plating metal, a silver catalyst is mainly used; when copper is the plating metal, a silver catalyst or a copper catalyst is mainly used; when nickel, cobalt, or gold or the like is the plating metal, a palladium catalyst or a tin catalyst or the like is mainly used. A single catalyst may be used alone, or a combination of two or more catalysts may be used.

Introduction of the catalyst onto the surface of the substrate can be performed using a conventional method. For example, an aqueous solution of a salt of the metal that is to act as the catalyst (for example, silver nitrate or a metal chloride or the like) is brought into contact with the substrate surface, the salt is adsorbed to the substrate surface, and the salt is then reduced. This enables the introduction of metal microparticles onto the substrate surface.

Moreover, in the present invention, in order to facilitate the formation of the metal thin film, the surface of the substrate may be subjected to a hydrophilic treatment prior to the thin film formation step. Particularly in those cases where a metal is used as the material for forming the nanostructure, performing a hydrophilic treatment on the substrate surface improves the hydrophilicity of (and activates) the template surface, and therefore by performing electroless plating onto the treated surface, a metal thin film can be formed at high density and with good adhesion. Further, performing a hydrophilic treatment facilitates the introduction of the catalyst for electroless plating onto the substrate surface during the thin film formation step. As a result, a metal thin film can be formed which has a shape that more accurately copies or transfers the uneven shape of the substrate.

Conventional methods can be used for the hydrophilic treatment, and examples include an oxygen plasma treatment, an ozone oxidation treatment, an acid alkali treatment, and a chemical modification treatment. Of these, an oxygen plasma treatment is preferable, as it is simple and requires only a short treatment time. Further, performing an oxygen plasma treatment not only activates the surface of the substrate, but by appropriate adjustment of the treatment conditions, also enables the height of the uneven shape of the substrate, namely the height of the nanostructure being formed, to be regulated. For example, the longer the treatment time for the oxygen plasma treatment becomes, the lower the height of the uneven shape of the substrate becomes, meaning the formation of a finer nanostructure.

For example, when using an oxygen plasma treatment, the pressure during the oxygen plasma treatment is preferably within a range from 1.33 to 66.5 Pa (10 to 50 mtorr), and more preferably from 13.3 to 26.6 Pa (100 to 200 mtorr). Further, the plasma output during the oxygen plasma treatment is preferably within a range from 5 to 500 W, and more preferably from 5 to 50 W. Furthermore, the treatment time for the oxygen plasma treatment is preferably within a range from 1 to 30 seconds, and more preferably from 2 to 5 seconds. Moreover, the temperature of the oxygen plasma treatment is preferably within a range from −30 to 300° C., more preferably from 0 to 100° C., and most preferably room temperature (5 to 40° C.). There are no particular limitations on the plasma apparatus used in the oxygen plasma treatment, and for example, a PE-2000 Plasma Etcher manufactured by South Bay Technology, USA or the like can be used.

Next, a portion or all of the metal thin film formed on the bottom surface portions of the recesses within the uneven shape, and formed on the top surface portions of the protrusions within the uneven shape is removed to form the nanostructure. By removing the metal thin film from the bottom surface portions of the recesses within the uneven shape and the top surface portions of the protrusions within the uneven shape, a nanostructure formed from the film coating the side wall portions of the protrusions, and having a thickness corresponding with the film thickness of the metal thin film can be formed.

The method used for removing the portion of the metal thin film may employ a conventional method, which may be selected with due consideration of the material that constitutes the metal thin film, and where necessary with due consideration of the nature of the substrate. Examples of conventional methods that can be used include etching, chemical treatments, physical stripping, and polishing treatments. Of these, if the coating film is a metal thin film, then an etching treatment is preferable, as it is simpler and has fewer treatment steps, and a dry etching treatment using argon or oxygen or the like is particularly preferable.

When removing the top surface portions of the aforementioned protrusions, by adjusting the degree of removal, the height of the formed nanostructure can be altered. For example, as the amount removed from the top surface portions of the coating film (namely, from the top edges of the side wall portions of the protrusions) is increased, the height of the formed nanostructure is reduced, and a finer nanostructure is obtained.

In this manner, when the top edges of the metal thin film are removed and the side wall portions of the protrusions within the metal thin film are used, a nano-level structure can be obtained with relative ease, even if the uneven shape on the substrate surface is not particularly fine.

<Metal Deposition Method Using Galvanic Substitution Reaction>

During the selective removal, if the phase composed of the $P_B$ block, which is formed in a continuous manner from the substrate surface through to the surface of the layer containing the block copolymer, is removed, then the surface of the substrate is exposed. Accordingly, when a substrate having a surface with electron donating properties is used, bringing metal ions into contact with the exposed substrate surface results in an electrochemical reaction occurring between the substrate surface and the metal ions, enabling a metal to be deposited on the surface of the substrate. The layer containing the residual block copolymer on the substrate surface (namely, the phase composed of the $P_A$ block) functions as a template, and a metal nanostructure is formed from the deposited metal. When the phase-separated structure is a lamellar structure or a cylinder structure arranged in a perpendicular direction relative to the surface of the substrate, by using the structure composed of the $P_A$ block as a template, a linear or cylindrical metal nanostructure can be formed directly on the substrate.

The metal ions may be any metal ions having a larger standard electrode potential than that of the metal incorporated within the substrate. Examples of the metal ions include ions of gold, silver, copper, nickel, cobalt, tin and platinum group metals (palladium, platinum, rhodium and ruthenium). Among these, when a silicon wafer is used as the substrate, the metal ions are preferably gold ions, silver ions or copper ions.

More specifically, the substrate having a portion of the surface exposed is immersed in an aqueous solution containing the metal ions. The immersion time within the aqueous metal solution can be adjusted appropriately with due consideration of the area of the exposed surface of the substrate, and the height and size and the like of the desired metal nanostructure. If the immersion time in the aqueous metal solution is too short, then regions on the exposed substrate surface in which the metal has not been deposited tend to occur, meaning the shape of the formed metal nanostructure does not exactly match the shape of the phase composed of the $P_B$ block which has been selectively removed. However, if the immersion time is too long, then the metal may be deposited outside the template, meaning a metal nanostructure cannot be formed with the same shape as that of the phase composed of the $P_B$ block which has been selectively removed.

EXAMPLES

Next, the present invention is described in further detail using a series of examples, but the scope of the present invention is in no way limited by these examples.

Example 1

A silicon substrate was immersed in a sulfuric acid/hydrogen peroxide water mixed solution (volume ratio: 7:3) for one hour, and the substrate was then washed with water, and dried under a stream of nitrogen gas. Subsequently, a toluene solution of phenethyltrichlorosilane (1.0% by volume) was dripped and spin-coated onto the surface of the substrate. The substrate was then heated at 250° C. for 60 seconds, and following a final immersion in toluene for 30 seconds, was dried under a stream of nitrogen gas.

This substrate was then spin-coated (revolution rate: 3,000 rpm, 60 seconds) with a toluene solution of a PS-PMMA block copolymer 1 (17.5 mg/ml) (molecular weight of PS: 53,000, molecular weight of PMMA: 54,000, polydispersity index (PDI): 1.16). The substrate having the PS-PMMA block copolymer coated thereon was then heated at 200° C. for one hour under a stream of nitrogen, thereby forming a phase-separated structure.

Next, the substrate was irradiated with UV for 30 minutes using an ozoneless low-pressure mercury lamp (254 nm) (manufactured by Sen Lights Corporation). When measured with an irradiance meter for 356 nm, the UV irradiance was 16.2 mW/cm². The UV exposure dose was calculated as 29.1 mJ/cm². Subsequently, the substrate was immersed for one minute in one of a variety of developing solutions, and the substrate was then dried with nitrogen gas. This resulted in a nanostructure having a surface formed only from the phase composed of PS being retained on the substrate. The steps from the UV irradiation through to the nitrogen gas drying are referred to as the developing treatment.

Following the developing treatment, the surface was observed using a scanning electron microscope. The results of the observation are shown in Table 1, together with the SP value and the vapor pressure at 25° C. for the organic solvent that represents the main component of the developing solution. In the case of methanol, the vapor pressure value represents the vapor pressure at 12° C. Substrates on which a nanostructure which reflected the phase-separated structure was formed were evaluated as "A", substrates on which a phase-separated structure was formed, but in which a portion of the nanostructure did not reflect the phase-separated structure and had undergone collapse of the nanopattern were evaluated as "B", and substrates on which a nanostructure having a distinct banded structure could not be observed were evaluated as "C". The results revealed that a nanostructure which reflected the phase-separated structure was observed when the organic solvent that represented the main component of the developing solution was butyl acetate, HP thinner (main component: 2-heptanone), PGMEA, or a mixed solution of PGMEA and ethyl acetate (PGMEA:ethyl acetate=10:1 (volume ratio)), each of which had an SP value within a range from 7.5 to 11.5 $(cal/cm^3)^{1/2}$ and a vapor pressure at 25° C. that was less than 2.1 kPa. In contrast, when the organic solvent that represents the main component of the developing solution was n-hexane or n-heptane, each of which has an SP value of less than 7.5 $(cal/cm^3)^{1/2}$, or was any one of GBL thinner (main component: γ-butyrolactone), ethanol or methanol, each of which has an SP value exceeding 11.5 $(cal/cm^3)^{1/2}$, a distinct nanostructure was not observed. Further, among THF, PGME, acetone, acetic acid and 1-propanol, each of which has an SP value within the range from 7.5 to 11.5 $(cal/cm^3)^{1/2}$, but has a vapor pressure at 25° C. of 2.1 kPa or greater, a portion of the nanopattern collapsed in the case of acetic acid, and a distinct nanostructure was not observed in the case of the other solvents besides acetic acid. It is thought that these results reflect the fact that because the vapor pressure was too high, localized volatilization of the developing solution organic solvent had occurred.

TABLE 1

| Developing solution (main component) | SP value $(cal/cm^3)^{1/2}$ | Vapor pressure (kPa) | Evaluation |
|---|---|---|---|
| n-hexane | 7.3 | 20.2 | C |
| n-heptane | 7.4 | 5.1 | C |
| butyl acetate | 8.5 | 1.7 | A |
| HP thinner (2-heptanone) | 8.5 | 0.2 | A |
| THF | 9.1 | 23.5 | C |
| PGMEA | 9.2 | 0.5 | A |
| PGME | 9.9 | 7.6 | C |
| acetone | 9.9 | 30.6 | C |
| acetic acid | 10.1 | 2.1 | B |
| 1-propanol | 11.5 | 2.7 | C |
| GBL thinner (γ-butyrolactone) | 12.6 | 0.4 | C |
| ethanol | 12.9 | 8.0 | C |
| methanol | 14.5 | 8.0 (12° C.) | C |

Figure 1:
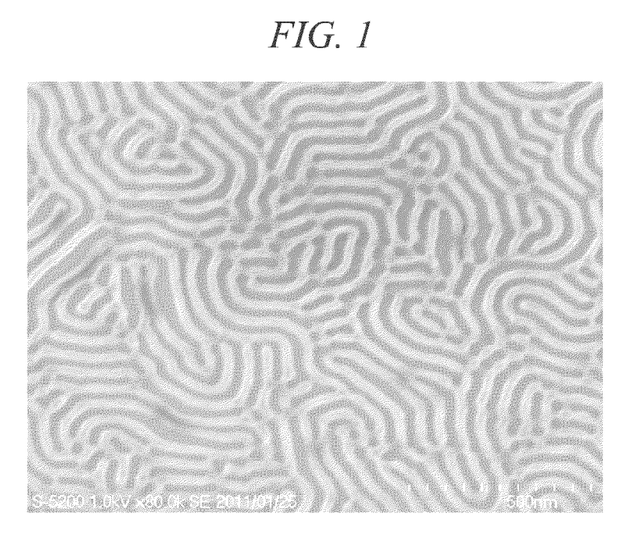
FIG. 1 is a scanning electron microscope image of the substrate surface when butyl acetate is used as the developing solution in Example 1.

Further, an electron microscope image of the surface of the substrate when butyl acetate was used as the developing solution is shown in FIG. 1.

Production Example 1

A negative resist composition solution used as an undercoat agent was produced.

Specifically, 100 parts by weight of a polymer represented by formula (A)-1 shown below (Mw=40,000), 2.5 parts by weight of a photoacid generator represented by formula (B)-1 shown below ((4-terphenylthiophenyl)diphenylsulfonium tris(pentafluoroethyl)trifluorophosphate), 150 parts by weight of a cross-linking agent represented by formula (C)-1 shown below, and 34,150 parts by weight of PGMEA were mixed together and dissolved to produce a negative resist composition solution (1% PGM EA solution). In formula (A)-1, the subscript numerals shown at the bottom right of the parentheses ( ) indicate the percentages (mol %) of the respective structural units.

[Chemical Formula 1]

(A)-1

-continued

[Chemical Formula 2]

(B)-1

[Chemical Formula 3]

(C)-1

Example 2

The effect on the developing treatment of the type of organic solvent used for dissolving the block copolymer was investigated.

A silicon substrate was immersed in a sulfuric acid/hydrogen peroxide water mixed solution (volume ratio: 7:3) for one hour, and the substrate was then washed with water, and dried under a stream of nitrogen gas. Subsequently, the negative resist composition solution produced in Production Example 1 was spin-coated (revolution rate: 2,000 rpm, 60 seconds) onto the surface of the substrate, and was then heated at 250° C. for 60 seconds. The substrate was then immersed in toluene for 30 seconds, and dried under a stream of nitrogen gas.

This substrate was then spin-coated (revolution rate: 3,000 rpm, 60 seconds) with a toluene solution, a PGMEA solution or an HP thinner solution (each having a concentration of 17.5 mg/ml) of the PS-PMMA block copolymer 1 used in Example 1. The substrate having the PS-PMMA block copolymer coated thereon was then heated at 200° C. for one hour under a stream of nitrogen, thereby forming a phase-separated structure. Next, using the same method as that described for Example 1, each substrate was irradiated with UV, subsequently immersed for one minute in a mixed solution of PGMEA and ethyl acetate (PGMEA: ethyl acetate=10:1 (volume ratio)), and then dried with nitrogen gas.

Observation of the substrate surfaces using a scanning electron microscope following the developing treatment revealed that with the substrates for which the PS-PMMA block copolymer 1 was dissolved in either toluene or PGMEA, a nanostructure that reflected the phase-separated structure was formed. In contrast, with the substrate for which the PS-PMMA block copolymer 1 was dissolved in HP thinner solution, although a phase-separated structure was observed prior to the developing treatment, a distinct nanostructure was not observed following the developing treatment. As is clear from these results, the form of the substrate surface following development differs depending on the type of organic solvent used for dissolving the applied block copolymer. Accordingly, in order to obtain a more distinct developed pattern, the solvent used for the block copolymer solution must be set appropriately.

Example 3

The effect of the UV exposure dose on the developing treatment was investigated.

A silicon substrate was immersed in a sulfuric acid/hydrogen peroxide water mixed solution (volume ratio: 7:3) for one hour, and the substrate was then washed with water, and dried under a stream of nitrogen gas. Subsequently, the negative resist composition solution produced in Production Example 1 was coated onto the surface of the substrate and then dried in the same manner as that described for Example 2.

This substrate was then spin-coated (revolution rate: 3,000 rpm, 60 seconds) with a toluene solution (17.5 mg/ml) of the PS-PMMA block copolymer 1 used in Example 1. The substrate having the PS-PMMA block copolymer coated thereon was then heated at 200° C. for one hour under a stream of nitrogen, thereby forming a phase-separated structure.

Next, the substrate was irradiated with UV for 0, 5, 10, 15 or 30 minutes using an ozoneless low-pressure mercury lamp (254 nm) (manufactured by Sen Lights Corporation). When measured with an irradiance meter for 356 nm, the UV irradiance was 18.4 mW/cm², meaning the UV exposure dose was calculated as an exposure at 365 nm of 0, 5.5, 11.0, 16.5 or 33.1 ml/cm² respectively. Subsequently, each substrate was immersed for one minute in PGMEA, and was then dried with nitrogen gas.

Observation of the substrate surfaces using a scanning electron microscope following the developing treatment revealed that for the substrate which was not irradiated with UV (irradiation time: 0 minutes), the layer composed of the block copolymer was dissolved and removed from the substrate, with almost no film remaining on the substrate. As the UV irradiation time was lengthened, a clearer nanostructure pattern was observed, but for the substrate which was irradiated with UV for 30 minutes, the nanopattern was actually less distinct than that of the substrate which was irradiated for 15 minutes. These results suggested that irradiating the substrate with UV such that the UV exposure dose satisfies a specific range is an important factor in obtaining a distinct developed pattern.

Example 4

A substrate having a surface nanostructure was produced by a graphoepitaxy process which used a substrate on which a guide pattern had been formed prior to formation of the layer containing the block copolymer.

First, an organic antireflective film composition ARC29A (a product name, manufactured by Brewer Science Ltd.) was spin-coated onto a silicon substrate to form a film having a thickness of 82 nm, and the substrate was then heated at 205° C. for 60 seconds. Next, spin-coating was used to form a film of SM-008T (a product name, manufactured by Tokyo Ohka Kogyo Co., Ltd.) having a thickness of 1 nm, and the substrate was then heated at 250° C. for 600 seconds.

Subsequently, SG-N002 PM (a product name, manufactured by Tokyo Ohka Kogyo Co., Ltd.) was applied to the surface of the substrate using a spinner, and by performing a prebake (PAB) treatment and drying on a hotplate at 85° C. for 60 seconds, a resist film for forming a guide pattern having a film thickness of 100 nm was formed.

The resist film for forming a guide pattern was selectively exposed through a mask pattern using an exposure apparatus S-302 (manufactured by Nikon Corporation, NA (numerical aperture)=0.60, σ=2/3) (exposure dose=17.5 mJ/cm²). Following exposure, developing was performed for 16 seconds in butyl acetate, and a postbake treatment was then performed at 100° C. for 60 seconds, and then at 200° C. for 300 seconds, resulting in the formation of a guide pattern composed of an L/S pattern having a line width of 160 nm and a space width of 160 nm.

Subsequently, a PGMEA solution of the PS-PMMA block copolymer 1 used in Example 1 (17.5 mg/ml) was spin-coated onto the surface of the substrate, and a prebake (PAB) treatment was performed at 110° C. for 60 seconds, thus forming a PS-PMMA block copolymer layer having a thickness of 60 nm. The substrate having the PS-PMMA block copolymer layer formed thereon was heated at 240° C. for 10 minutes under a stream of nitrogen, thus forming a phase-separated structure.

Using an ozoneless low-pressure mercury lamp (254 nm) (manufactured by Sen Lights Corporation), the substrate was irradiated with UV under a stream of nitrogen so as to achieve a UV exposure dose of 36 mJ/cm$^2$. Subsequently, the substrate was immersed in PGMEA for one minute, and was then dried under a stream of nitrogen gas.

Figure 2:
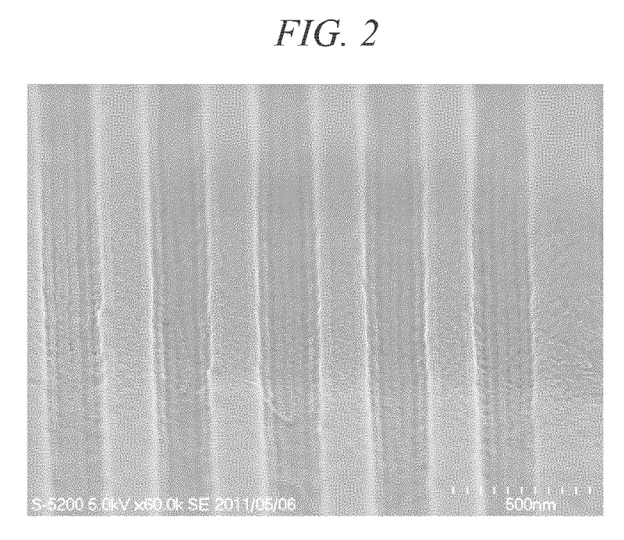
FIG. 2 is a scanning electron microscope image of the substrate surface following the developing treatment in Example 4.

Following the developing treatment, the surface of the substrate was observed using a scanning electron microscope. A scanning electron microscope image of the substrate surface following the developing treatment is shown in FIG. 2. The results revealed that a distinct parallel line pattern having a width of approximately 50 nm and a height of approximately 100 nm had been formed between the template lines of the guide pattern and parallel with the lines of the guide pattern.

Example 5

A silicon substrate was immersed in a sulfuric acid/hydrogen peroxide water mixed solution (volume ratio: 7:3) for one hour, and the substrate was then washed with water, and dried under a stream of nitrogen gas. Subsequently, a toluene solution of phenethyltrichlorosilane (1.0% by volume) was dripped and spin-coated onto the surface of the substrate. The substrate was then heated at 250° C. for 60 seconds, and following a final immersion in toluene for 30 seconds, was dried under a stream of nitrogen gas.

This substrate was then spin-coated (revolution rate: 3,000 rpm, 60 seconds) with a toluene solution of the PS-PMMA block copolymer 1 (17.5 mg/ml) (molecular weight of PS: 53,000, molecular weight of PMMA: 54,000, polydispersity index (PDI): 1.16). The substrate having the PS-PMMA block copolymer coated thereon was then heated at 200° C. for one hour under a stream of nitrogen, thereby forming a phase-separated structure.

Next, the substrate was irradiated with UV for 30 minutes using an ozoneless low-pressure mercury lamp (254 nm) (manufactured by Sen Lights Corporation). When measured with an irradiance meter for 356 nm, the UV irradiance was 16.2 mW/cm$^2$. The UV exposure dose was calculated as 29.1 mJ/cm$^2$. Subsequently, the substrate was immersed for one minute in either toluene (special grade) or benzene, and the substrate was then dried with nitrogen gas. This resulted in a nanostructure having a surface formed only from the phase composed of PS being retained on the substrate. The steps from the UV irradiation through to the nitrogen gas drying are referred to as the developing treatment.

Following the developing treatment, the surface was observed using a scanning electron microscope. The results revealed that regardless of whether toluene or benzene was used as the developing solution, a nanostructure that reflected the phase-separated structure was observed.

Example 6

A silicon substrate was immersed in a sulfuric acid/hydrogen peroxide water mixed solution (volume ratio: 7:3) for one hour, and the substrate was then washed with water, and dried under a stream of nitrogen gas. Subsequently, a toluene solution of phenethyltrichlorosilane (1.0% by volume) was dripped and spin-coated onto the surface of the substrate. The substrate was then heated at 250° C. for 60 seconds, and following a final immersion in toluene for 30 seconds, was dried under a stream of nitrogen gas.

This substrate was then spin-coated (revolution rate: 3,000 rpm, 60 seconds) with a toluene solution of a PS-PMMA block copolymer 2 (17.5 mg/ml) (molecular weight of PS: 18,000, molecular weight of PMMA: 18,000, polydispersity index: 1.06), and a prebake (PAB) treatment was then performed at 110° C. for 90 seconds, thus forming a PS-PMMA block copolymer layer having a thickness of 50 to 60 nm. The substrate having the PS-PMMA block copolymer layer formed thereon was heated at 200° C. for one hour under a stream of nitrogen, thereby forming a phase-separated structure.

Using an ozoneless low-pressure mercury lamp (254 nm) (manufactured by Sen Lights Corporation), the substrate was irradiated with UV under a stream of nitrogen gas so as to achieve a UV exposure dose of 15 mJ/cm$^2$. Subsequently, the substrate was immersed in toluene (special grade) for one minute, and was then dried under a stream of nitrogen gas.

Observation of the substrate surface using a scanning electron microscope following the developing treatment revealed that a nanostructure which reflected the phase-separated structure and had a width of approximately 20 nm and a height of approximately 50 nm had been formed. Accordingly, it was confirmed that even when a block copolymer having a comparatively low molecular weight was used, a distinct pattern could be formed.

Example 7

A substrate having a surface nanostructure was produced by a graphoepitaxy process which used a substrate on which a guide pattern had been formed prior to formation of the layer containing the block copolymer.

First, a silicon substrate was immersed in a sulfuric acid/hydrogen peroxide water mixed solution (volume ratio: 7:3) for one hour, and the substrate was then washed with water, and dried under a stream of nitrogen gas. Subsequently, a toluene solution of phenethyltrichlorosilane (1.0% by volume) was dripped and spin-coated onto the surface of the substrate. The substrate was then heated at 250° C. for 60 seconds, and following a final immersion in toluene for 30 seconds, was dried under a stream of nitrogen gas.

Subsequently, TSMR-iN027 (a product name, manufactured by Tokyo Ohka Kogyo Co., Ltd.) was applied to the surface of the substrate using a spinner, and by performing a prebake (PAB) treatment and drying on a hotplate at 90° C. for 60 seconds, a resist film for forming a guide pattern having a film thickness of 350 nm was formed.

The resist film for forming a guide pattern was selectively exposed using an i-line exposure apparatus NSR-2205i14E (manufactured by Nikon Corporation, NA (numerical aperture)=0.57, σ=0.56) by irradiating a high-pressure mercury lamp (365 nm) for 170 ms (exposure dose=85 mJ/cm$^2$) through a mask pattern (6% half tone). A post exposure bake (PEB) treatment was then performed at 120° C. for 60 seconds, and developing was then performed at 23° C. for 60 seconds in a 2.38% by weight aqueous solution of TMAH (product name: NMD-3, manufactured by Tokyo Ohka Kogyo Co., Ltd.). Subsequently, following a postbake treatment at 100° C. for 60 seconds, the entire surface of the wafer was irradiated, without using a mask, with ultraviolet light at 500 mJ/cm$^2$ from a ghi-line broadband exposure apparatus HMW-532D (manufactured by ORC Manufacturing Co., Ltd.), and a postbake treatment was then performed at 130° C. for 5 minutes, and then at 200° C. for 5 minutes. As a result, an L/S pattern having a line width of 500 nm and a space width of 250 nm was formed as a guide pattern.

Subsequently, the toluene solution of the PS-PMMA block copolymer 1 used in Example 5 was spin-coated onto the surface of the substrate (revolution rate: 3,000 rpm, 60 seconds), and a prebake (PAB) treatment was performed at 110° C. for 90 seconds, thus forming a PS-PMMA block copolymer layer having a thickness of 50 to 60 nm. The substrate having the PS-PMMA block copolymer layer formed thereon was heated at 200° C. for one hour under a stream of nitrogen, thus forming a phase-separated structure.

Using an ozoneless low-pressure mercury lamp (254 nm) (manufactured by Sen Lights Corporation), the substrate was irradiated with UV under a stream of nitrogen gas so as to achieve a UV exposure dose of 36 mJ/cm$^2$. Subsequently, the substrate was immersed in toluene (special grade) for three minutes, and was then dried under a stream of nitrogen.

Figure 3:
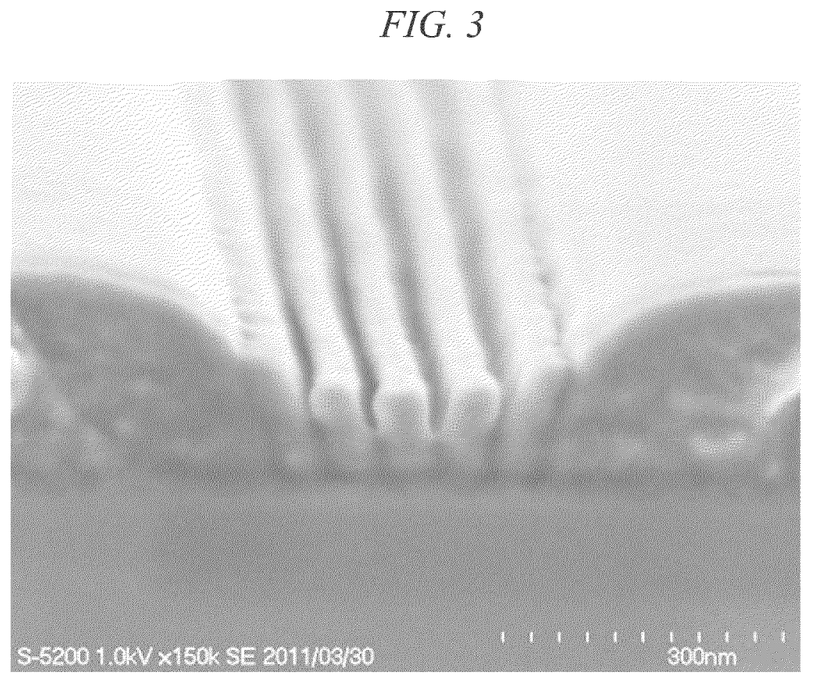
FIG. 3 is a scanning electron microscope image of the substrate surface following the developing treatment in Example 7.

Following the developing treatment, the surface of the substrate was observed using a scanning electron microscope. A scanning electron microscope image of the substrate surface following the developing treatment is shown in FIG. 3. The results revealed that a distinct parallel line pattern having a width of approximately 50 nm and a height of approximately 100 nm had been formed between the template lines of the guide pattern and parallel with the lines of the guide pattern.

Example 8

With the exceptions of performing the postbake treatment of the resist film for forming a guide pattern at 130° C. for 5 minutes, forming an L/S pattern having a line width of 350 nm and a space width of 350 nm as the guide pattern, and using a toluene solution (17.5 mg/ml) of a PS-PMMA block copolymer 3 (molecular weight of PS: 37,000, molecular weight of PMMA: 37,000, polydispersity index: 1.08) instead of the toluene solution of the PS-PMMA block copolymer 1, the same method as that described for Example 7 was used to form a guide pattern on a silicon substrate, subsequently form a PS-PMMA block copolymer layer on the substrate, and then form a phase-separated structure.

Using an ozoneless low-pressure mercury lamp (254 nm) (manufactured by Sen Lights Corporation), the substrate was irradiated with UV under a stream of nitrogen so as to achieve a UV exposure dose of 36 mJ/cm$^2$. Subsequently, the substrate was immersed in toluene (special grade) for 5 minutes, and was then dried under a stream of nitrogen gas.

Observation of the substrate surface using a scanning electron microscope following the developing treatment revealed that, in a similar manner to Example 7, a parallel line pattern had been formed between the template lines of the guide pattern, although the guide pattern did exhibit slight waviness.

Example 9

With the exceptions of performing the postbake treatment of the resist film for forming a guide pattern at 200° C. for 5 minutes, forming an L/S pattern having a line width of 350 nm and a space width of 350 nm as the guide pattern, and using the toluene solution of the PS-PMMA block copolymer 2 used in Example 6 instead of the toluene solution of the PS-PMMA block copolymer 1, the same method as that described for Example 7 was used to form a guide pattern on a silicon substrate, subsequently form a PS-PMMA block copolymer layer on the substrate, and then form a phase-separated structure.

Using an ozoneless low-pressure mercury lamp (254 nm) (manufactured by Sen Lights Corporation), the substrate was irradiated with UV under a stream of nitrogen so as to achieve a UV exposure dose of 30 mJ/cm$^2$. Subsequently, the substrate was immersed in toluene (special grade) for 10 minutes, and was then dried under a stream of nitrogen gas.

Observation of the substrate surface using a scanning electron microscope following the developing treatment revealed that, in a similar manner to Example 7, a parallel line pattern had been formed between the template lines of the guide pattern, although the guide pattern did exhibit slight waviness.

Example 10

With the exception of forming a hole resist pattern having a hole diameter of 310 nm and a pitch of 980 nm as the guide pattern instead of the L/S pattern, the same method as that described for Example 9 was used to form a guide pattern on a silicon substrate, subsequently form a PS-PMMA block copolymer layer on the substrate, form a phase-separated structure, and then perform a developing treatment.

Observation of the substrate surface using a scanning electron microscope following the developing treatment revealed that a cylindrical nanostructure which was concentric with the template holes and reflected the phase-separated structure had been formed inside the template holes of the guide pattern.

Example 11

A substrate having a surface nanostructure was produced by a graphoepitaxy process which used a substrate on which a guide pattern had been formed prior to formation of the layer containing the block copolymer.

First, an organic antireflective film composition ARC29A (a product name, manufactured by Brewer Science Ltd.) was spin-coated onto a silicon substrate to form a film having a thickness of 82 nm, and the substrate was then heated at 205° C. for 60 seconds. Next, spin-coating was used to form a film of SM-008T (a product name, manufactured by Tokyo Ohka Kogyo Co., Ltd.) having a thickness of 1 nm, and the substrate was then heated at 250° C. for 600 seconds.

Subsequently, SG-N002 PM (a product name, manufactured by Tokyo Ohka Kogyo Co., Ltd.) was applied to the surface of the substrate using a spinner, and by performing a prebake (PAB) treatment and drying on a hotplate at 85° C. for 60 seconds, a resist film for forming a guide pattern having a film thickness of 100 nm was formed.

The resist film for forming a guide pattern was selectively exposed through a mask pattern using an exposure apparatus S-308F (manufactured by Nikon Corporation, NA (numerical aperture)=0.92, Crosspole (0.76 to 0.95) with POLANO) (exposure dose=11 mJ/cm$^2$). Following exposure, developing was performed for 16 seconds in butyl acetate, and a postbake treatment was then performed at 100° C. for 60 seconds and then at 200° C. for 300 seconds, resulting in the formation of a guide pattern composed of a hole resist pattern having a hole diameter of 85 nm and a pitch of 158 nm.

Subsequently, a PGMEA solution of a PS-PMMA block copolymer (8.0 mg/ml) was spin-coated onto the surface of the substrate, and a prebake (PAB) treatment was performed at 110° C. for 60 seconds, thus forming a PS-PMMA block copolymer layer having a thickness of 20 nm. The substrate having the PS-PMMA block copolymer layer formed thereon was heated at 240° C. for 60 seconds in an air atmosphere, thus forming a phase-separated structure. Using an ArF exposure apparatus S-308F (193 nm) (manufactured by Nikon Corporation), the substrate was irradiated with an ArF excimer laser in an air atmosphere so as to achieve an ArF exposure dose of 400 to 4,000 mJ/cm$^2$. Subsequently, the substrate was immersed in toluene for one minute, and was then dried under a stream of nitrogen gas.

Observation of the substrate surface using a scanning electron microscope following the developing treatment revealed that a cylindrical nanostructure which was concentric with the template holes and reflected the phase-separated structure had been formed inside the template holes of the guide pattern.

Example 12

With the exception of using butyl acetate instead of toluene as the developing solution, the same method as that described for Example 11 was used to form a guide pattern on a silicon substrate, subsequently form a block copolymer layer on the substrate, form a phase-separated structure, and then perform a developing treatment.

Observation of the substrate surface using a scanning electron microscope following the developing treatment revealed that a cylindrical nanostructure which was concentric with the template holes and reflected the phase-separated structure had been formed inside the template holes of the guide pattern.

Example 13

With the exception of using 2-heptanone instead of toluene as the developing solution, the same method as that described for Example 11 was used to form a guide pattern on a silicon substrate, subsequently form a block copolymer layer on the substrate, form a phase-separated structure, and then perform a developing treatment.

Observation of the substrate surface using a scanning electron microscope following the developing treatment revealed that a cylindrical nanostructure which was concentric with the template holes and reflected the phase-separated structure had been formed inside the template holes of the guide pattern.

INDUSTRIAL APPLICABILITY

The present invention is able to provide a method that can produce a substrate having a nanostructure which more precisely reflects a nanophase-separated structure, and therefore the invention is extremely useful industrially.

The invention claimed is:

1. A method for producing a substrate having a surface nano structure, the method comprising:
   forming, on a substrate, a layer containing a block copolymer having a plurality of blocks bonded together, and subsequently heating the layer to cause phase separation of the layer,
   decomposing at least a portion of a phase composed of at least one block of the plurality of blocks that constitute the block copolymer of the layer, and
   immersing the layer in a developing solution and selectively removing a phase containing the decomposed block, the developing solution comprising, as a main component, an organic solvent having an SP value of 7.5 to 11.5 (cal/cm$^3$)$^{1/2}$ and a vapor pressure at 25° C. that is less than 2.1 kPa, or benzene which may be substituted with an alkyl group, an alkoxy group or a halogen atom.

2. The method for producing a substrate having a surface nanostructure according to claim 1, wherein the developing solution comprises at least one compound selected from the group consisting of butyl acetate, 2-heptanone and propylene glycol monomethyl ether acetate.

3. The method for producing a substrate having a surface nanostructure according to claim 1, wherein the developing solution comprises at least one compound selected from the group consisting of benzene, toluene, ethylbenzene, xylene, anisole and chlorobenzene.

4. The method for producing a substrate having a surface nanostructure according to claim 1, wherein the decomposing is performed by irradiating ultraviolet rays onto the layer.

5. The method for producing a substrate having a surface nanostructure according to claim 4, wherein an ultraviolet exposure dose on the layer at a wavelength of 254 nm is within a range from 1 to 100 mJ/cm$^2$.

6. The method for producing a substrate having a surface nanostructure according to claim 5, wherein an ultraviolet exposure dose on the layer at a wavelength of 254 nm is within a range from 10 to 50 mJ/cm$^2$.

7. The method for producing a substrate having a surface nanostructure according to claim 1, wherein the decomposing is performed by irradiating an ArF excimer laser onto the layer.

8. The method for producing a substrate having a surface nanostructure according to claim 7, wherein an ArF exposure dose on the layer at a wavelength of 193 nm is within a range from 400 to 4,000 mJ/cm$^2$.

9. The method for producing a substrate having a surface nanostructure according to claim 8, wherein an ArF exposure dose on the layer at a wavelength of 193 nm is within a range from 800 to 3,600 mJ/cm$^2$.

10. The method for producing a substrate having a surface nanostructure according to claim 1, wherein the block copolymer comprises a polystyrene and a polymethyl methacrylate.

11. The method for producing a substrate having a surface nanostructure according to claim 10, wherein the organic solvent is at least one organic solvent selected from the group consisting of toluene, butyl acetate, 2-heptanone and PGMEA.

12. The method for producing a substrate having a surface nanostructure according to claim 1, wherein
   a portion of a surface of the substrate is exposed by the selective removal, and the method further comprises, following the selective removal,
   bringing a metal ion into contact with the exposed surface of the substrate, and using an electrochemical reaction that occurs between the surface of the substrate and the metal ion to deposit a metal on the surface of the substrate.

13. The method for producing a substrate having a surface nanostructure according to claim 12, wherein the metal ion is gold, silver, copper, nickel, cobalt, tin, palladium, platinum, rhodium or ruthenium.

14. The method for producing a substrate having a surface nanostructure according to claim 1, wherein the method further comprises, following selective removal,
   forming a metal thin film on a surface of the layer, and
   removing part or all of the layer while retaining part or all of the metal thin film.

15. The method for producing a substrate having a surface nanostructure according to claim 14, wherein the metal for forming the metal thin film is at least one metal selected from the group consisting of gold, silver, copper, nickel and cobalt.

16. The method for producing a substrate having a surface nanostructure according to claim 1, wherein the developing solution comprises, as a main component, an organic solvent having an SP value of 8.0 to 10.5 $(cal/cm^3)^{1/2}$ and a vapor pressure at 25° C. that is less than 2.1 kPa.

17. The method for producing a substrate having a surface nanostructure according to claim 1, wherein the developing solution comprises, as a main component, an organic solvent having an SP value of 8.4 to 9.5 $(cal/cm^3)^{1/2}$ and a vapor pressure at 25° C. that is less than 2.1 kPa.

18. The method for producing a substrate having a surface nanostructure according to claim 1, wherein the method further comprises a neutralization treatment in which a thin film containing an undercoat agent having affinity for all the blocks that constitute the block copolymer is formed on the surface of the substrate, prior to forming the layer containing the block copolymer.

19. The method for producing a substrate having a surface nanostructure according to claim 1, wherein the substrate is provided with a guide pattern on the surface, prior to formation of the layer containing the block copolymer.

20. The method for producing a substrate having a surface nanostructure according to claim 19, wherein the guide pattern is a structure having a shape of an L/S pattern or a contact hole pattern.

\* \* \* \* \*